United States Patent [19]

Seacrist et al.

[11] Patent Number: 4,939,099
[45] Date of Patent: Jul. 3, 1990

[54] PROCESS FOR FABRICATING ISOLATED VERTICAL BIPOLAR AND JFET TRANSISTORS

[75] Inventors: Michael R. Seacrist, Grapevine; Joe R. Trogolo, Plano; Kenneth M. Bell, Windom, all of Tex.

[73] Assignee: Texas Instruments Incorporated, Dallas, Tex.

[21] Appl. No.: 411,210

[22] Filed: Sep. 21, 1989

Related U.S. Application Data

[60] Continuation of Ser. No. 211,641, Jun. 27, 1988, abandoned, which is a division of Ser. No. 209,449, Jun. 21, 1988.

[51] Int. Cl.$^5$ ............................................. H01L 29/80
[52] U.S. Cl. ......................................... 437/31; 437/40; 437/47; 437/60; 437/76; 357/22; 357/43; 357/51; 357/59
[58] Field of Search ................. 437/31, 32, 33, 59, 437/153, 154, 76, 40, 47, 60; 357/43, 22 E, 22 F, 47, 59, 51

[56] References Cited

U.S. PATENT DOCUMENTS

| 3,595,715 | 7/1971 | Thiré et al. | 437/76 |
| 3,930,909 | 1/1976 | Schmitz et al. | 437/76 |
| 4,295,898 | 10/1981 | Yoshida et al. | 437/31 |
| 4,419,812 | 12/1983 | Topich | 357/51 |
| 4,441,249 | 4/1984 | Alspector et al. | 357/59 |
| 4,512,815 | 4/1985 | Khadder et al. | 437/59 |
| 4,549,193 | 10/1985 | Malhi et al. | 357/43 |
| 4,740,821 | 4/1988 | Bertotti et al. | 357/22 |
| 4,806,499 | 2/1989 | Shinohara | 437/31 |
| 4,816,880 | 3/1989 | Muro | 357/41 |

FOREIGN PATENT DOCUMENTS

| 3621179 | 1/1988 | Fed. Rep. of Germany | 357/43 |
| 0113269 | 9/1979 | Japan | 357/43 |

Primary Examiner—Brian E. Hearn
Assistant Examiner—Tuan Nguyen
Attorney, Agent, or Firm—B. Peter Barndt; James T. Comfort; Melvin Sharp

[57] ABSTRACT

A unified process flow for the fabrication of an isolated vertical PNP (VPNP) transistor, a junction field effect transistor (JFET) and a metal/nitride/polysilicon capacitor includes the simultaneous fabrication of deep junction isolation regions (36, 121) and a VPNP buried collector (28). Junction isolation is completed by the doping and diffusion of shallow junction isolation regions (46, 122) at the same time that deep collector regions (48) are formed. A JFET source region (74) and a drain region (76) are formed simultaneously with a VPNP emitter region (70). A JFET gate contact region (88) is formed simultaenously with a VPNP base contact region (84), a VPNP buried region contact (86) and optionally with the doping of a capacitor electrode (124).

24 Claims, 2 Drawing Sheets

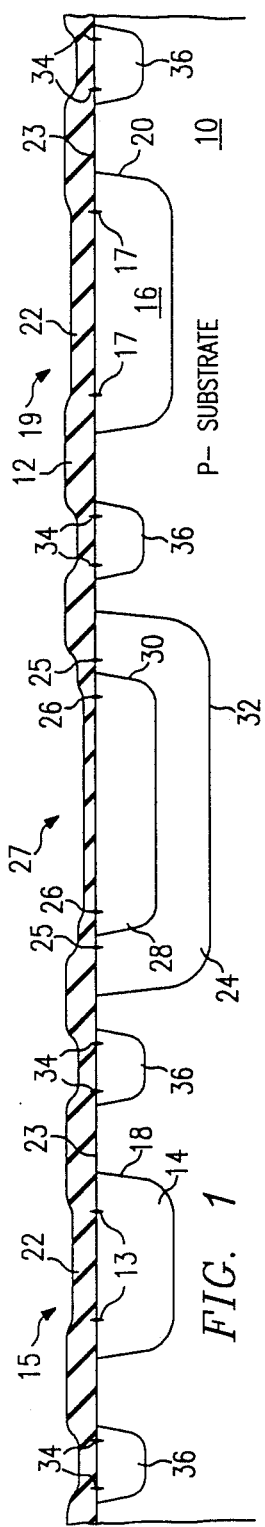
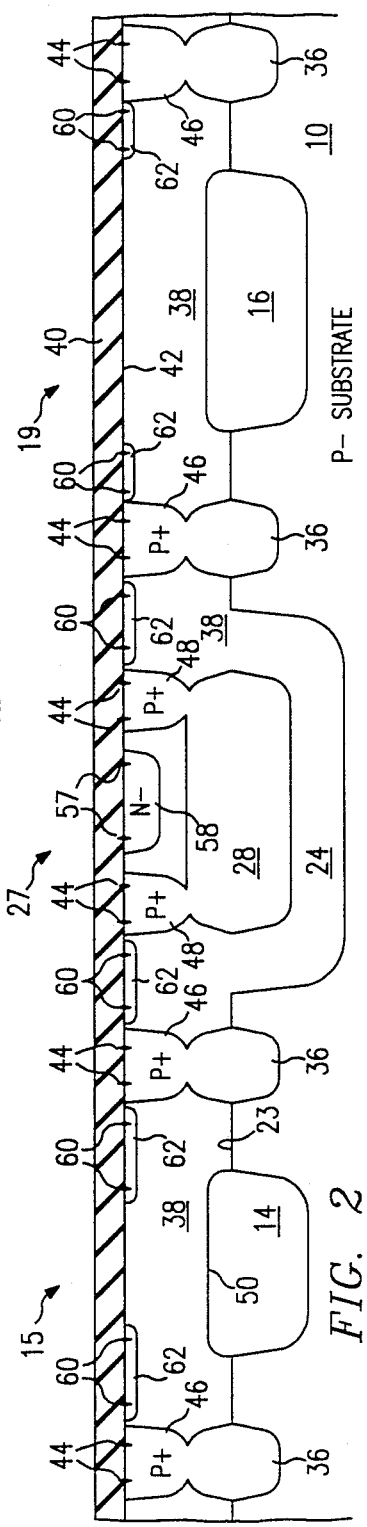
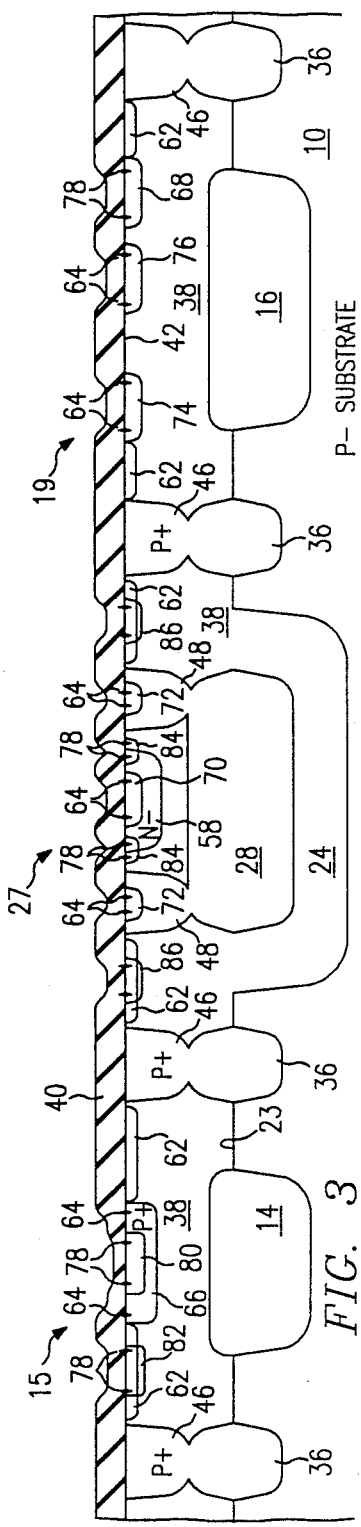

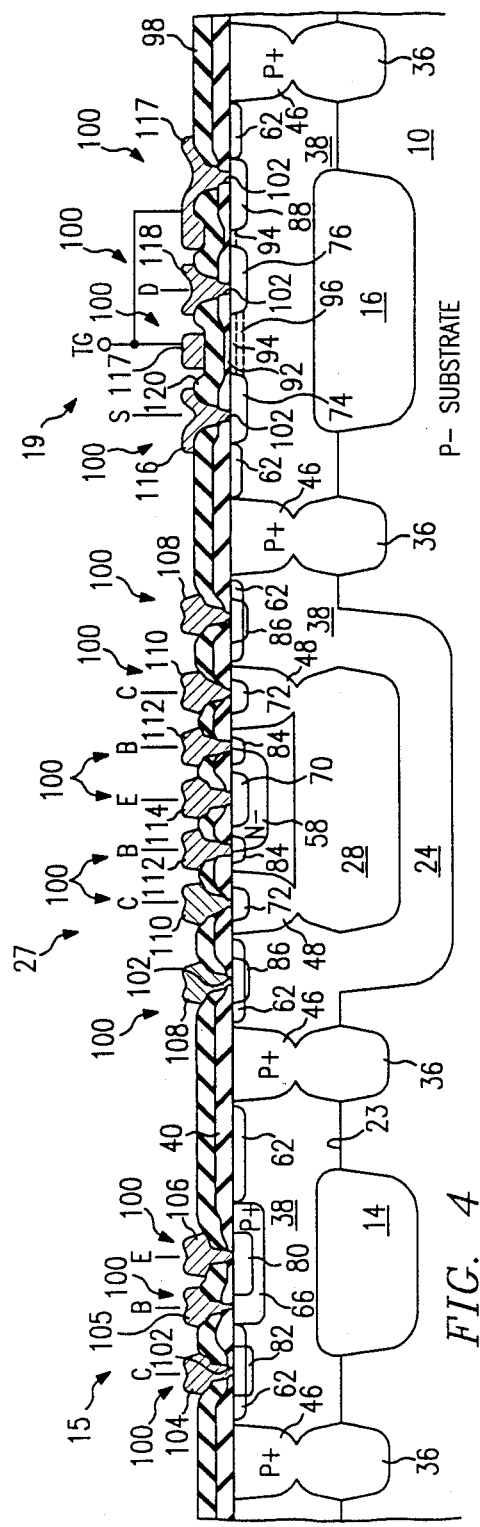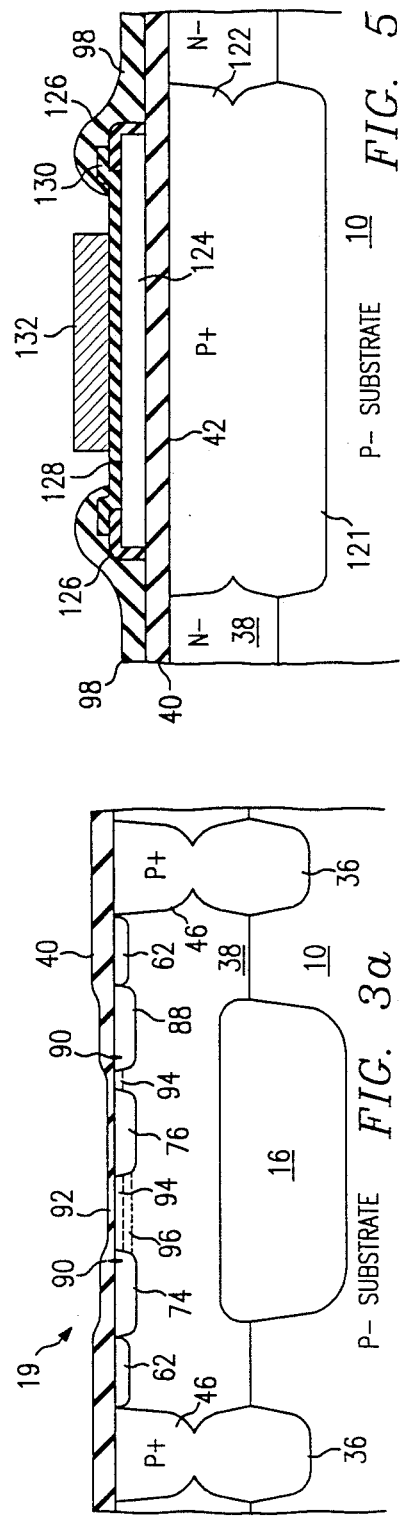

PROCESS FOR FABRICATING ISOLATED VERTICAL BIPOLAR AND JFET TRANSISTORS

RELATED APPLICATION

This application is a continuation of application Ser. No. 211,641, filed June 27, 1988, now abandoned, which was division of application Ser. No. 209,449, filed June 21, 1988.

TECHNICAL FIELD OF THE INVENTION

This invention relates in general to the fabrication of different integrated circuit devices using a single semiconductor substrate, and more particularly to a process for simultaneously fabricating a vertical bipolar transistor and a junction field effect transistor (JFET) and the integrated circuit produced thereby.

BACKGROUND OF THE INVENTION

Operational amplifier designs have always been limited in that conventional PNP integrated circuit transistors used therefor can operate only to around 5 megahertz. These PNP transistors in combination with conventional NPN transistors are typical devices found in operational amplifier integrated circuits.

Recently, a high-frequency isolated vertical PNP (VPNP) transistor has been developed that is superior to the conventional and substrate PNP transistors. This isolated VPNP transistor is capable of 45-volt operation and exhibits a maximum operating frequency around 150 megahertz. The current gain and breakdown voltages on the isolated VPNP transistor are comparable to those achieved on the standard double diffused NPN transistor. Finally, the isolated VPNP is not limited to the emitter-follower configuration taken by the normal vertical substrate PNP transistor.

Separately, a 50-volt (p) channel JFET has been developed to extend the gate-to-drain breakdown voltage past 45 volts. JFETs of this kind are conventionally used as operational amplifier inputs. These JFETs are achieved by using a thick deposited oxide over the gate oxide to reduce the electric field intensification at the top gate/drain reverse-biased p-n junction. This increases the gate-to-drain breakdown voltage from the low 30 volt range to approximately 50 volts. The gate-to-drain and gate-to-source oxides overlap capacitances are also reduced with the deposited oxide. This contributes to higher bandwidths and slew rates.

Another desirable integrated circuit component is the metal/nitride/poly capacitor. The use of nitride in the place of oxide provides a doubling of the capacitance and allows for a dielectric breakdown in excess of 100 volts, and the fabrication of these capacitors on field oxide reduces parasitic junction capacitance and tank leakage currents.

It is therefore desirable to develop a process for the fabrication of an integrated circuit including each of these devices. As yet, no such process has been heretofore developed, limiting circuit designers to the use of one of these circuit devices without the others in any one integrated circuit.

SUMMARY OF THE INVENTION

One aspect of the present invention comprises a process for the simultaneous fabrication of a vertical bipolar transistor and a junction field effect transistor (JFET) using a single semiconductor substrate. According to this process, a JFET buried region of a second conductivity type is formed at a face of the semiconductor substrate. A bipolar buried region of the second conductivity type is next formed at the face so as to be spaced from the JFET buried region. A collector region of the first conductivity type is formed at the face of the semiconductor substrate and within the bipolar buried region. Thereafter, an epitaxial semiconductor layer of the second conductivity type is formed on the face of the semiconductor substrate.

A thermal diffusion step is next performed to extend the JFET buried region and the bipolar collector region into the epitaxial layer. Then, a deep collector region of the first conductivity type is formed to extend from an outer face of the epitaxial layer to the collector region. A base region of the first conductivity type is formed at the face of the epitaxial layer over the collector region so as to be spaced therefrom. Next, an emitter region, a JFET source region and a JFET drain region are simultaneously formed to be of the first conductivity type and at the face of the epitaxial layer. The emitter region is formed within the base region, while the source and drain regions of the JFET are formed over and spaced from the JFET buried region. Thereafter, a base contact region for the bipolar transistor and a gate contact region for the JFET are simultaneously formed to be of the second conductivity type at the face of the epitaxial layer. The base contact region is formed within the base region and spaced from the emitter region, while the gate contact region is formed over the JFET buried region and spaced from the source and drain regions.

According to another aspect of the invention, a metal/dielectric/polysilicon capacitor can be formed within the process flow of either the JFET transistor by itself or within a process flow of both the JFET and vertical bipolar transistors. A further deep junction isolation region of the first conductivity type is formed at the same time as at least one other deep junction isolation region used to electrically separate the fabricated devices.

Dopant from these deep junction isolation regions are simultaneously up-diffused into the epitaxial layer. At least two shallow junction isolation regions of the first conductivity type are formed in the epitaxial layer. Dopant from the shallow junction isolation regions is down-diffused such that the deep and shallow junction isolation regions form continuous junction isolation regions.

During subsequent diffusion steps, a thick layer of field oxide is formed over the junction isolation region over which the capacitor will be built. A polysilicon layer is deposited, patterned and etched on top of the field oxide layer, and is preferably doped simultaneously with the formation of the JFET gate contact region.

The incorporation of the fabrication steps of these devices into a single process flow has the advantage of greatly reducing the number of mask levels required for the separate fabrication of each. An integrated circuit containing these three devices gives integrated circuit designers much more leeway and flexibility than the more conventional devices that they supplement. The combination of the VPNP transistor, the 50-volt (p) channel JFET, the metal/nitride/polysilicon capacitor, and double-diffused junction isolation, as used on a substrate of (100) crystallographic orientation, achieves tight input offset voltage control. These enhancements combine to provide circuit designs with the opportunity to design high performance control circuits capable of 5× bandwidth improvement, fast settling times (200 nanoseconds), precise input offset voltage control (+/− 100 microvolts), and other key design enhancements. The process is compatible with more conventional 45 volt vertical NPN transistors, high sheet resistors, 45 volt threshold voltages, and other common features of linear bipolar/JFET fabrication processes. The double (up and down) diffused isolation preferably used in the construction of the devices of the invention allows for a tighter design layout and can save up to 25% layout area on spacing relative to single-diffusion isolation.

BRIEF DESCRIPTION OF THE DRAWINGS

Other aspects of the invention and their advantages will become apparent by referring to the following detailed description in conjunction with the drawings in which:

FIGS. 1–4 are greatly enlarged schematic sections showing successive stages of fabricating a vertical PNP transistor, a p-channel JFET and a vertical NPN transistor according to the invention;

FIG. 3a is a detail of the sectional view shown in FIG. 3, showing additional JFET fabrication steps; and FIG. 5 is a greatly enlarged schematic sectional view of a metal/nitride/polysilicon capacitor that can be fabricated in conjunction with the devices shown in FIGS. 1–4.

DETAILED DESCRIPTION OF THE INVENTION

Referring first to FIG. 1, a (p−) silicon substrate 10 is shown in a greatly enlarged and schematic view. Silicon substrate 10 may have either (100) or (111) crystallographic orientation, although (100) orientation is preferred. An initial oxide layer 12, here shown after several patternings, etches and regrowths of replacement oxide, is grown on substrate 10. After this, a portion of oxide layer 12 between limits 13 (schematically shown by hash marks) is removed using conventional pattern-and-etch techniques to create a mask for the implantation of an (n+) buried collector region 14 for an NPN vertical transistor in an NPN bipolar transistor area indicated generally at 15. At the same time, an (n+) buried region 16 is masked in oxide layer 12 to limits 17 in a (p) channel JFET area of the substrate indicated generally at 19. The sheet resistance of the buried collector region 14 and JFET buried region 16 should be approximately 15 Ohms/square, and a preferred dopant is antimony.

After the implantation of the dopant, substrate 10 is subjected to a thermal diffusion step to give the respective approximate conductivity type boundaries 18 and 20 of the buried regions 14 and 16 as shown. During this and subsequent thermal diffusion steps, oxide portions, such as portions 22, will grow back wherever the outer surface 23 of the silicon substrate 10 has been exposed before the previous implantation step.

Next, oxide layer 12 is removed within limits 25 and an (n−) buried region 24 is implanted and thermally diffused within a vertical PNP transistor area indicated generally at 27. The dopant concentration used to implant buried region 24 is much less than that of collector region 14 and JFET buried region 16, as using the same dopant level would overwhelm the vertical PNP collector region subsequently formed and described immediately below.

In a similar manner, the oxide layer 12 is again removed within limits 26 to mask an implantation step for forming a (p) vertical PNP transistor collector region 28. A preferred implanted dopant species is boron. The (p) dopant is diffused by means of a thermal cycle such that the approximate final limit between (p) type and (n) type material is marked by boundary 30. The distance between boundary 30 of VPNP transistor collector region 28 and the boundary 32 of buried region 24 must be sufficient to isolate collector region 28 from the (p−) substrate 10, and to withstand more than the maximum operating voltage potential and not have a punch-through voltage breakdown.

Simultaneously with the removal of oxide from layer 12 within limits 26, oxide is removed within limits 34 such that the (p) type dopant implanted into region 28 will also be implanted into a plurality of deep junction isolation regions 36. Regions 36 are provided to isolate the devices from each other such that parasitic transistor devices will not be formed.

Turning now to FIG. 2, oxide layer 12 is stripped and an (n−) epitaxial silicon layer 38 is grown on the surface 23 of semiconductor substrate 10. A second oxide layer 40 is grown from an outer surface 42 of epitaxial layer 38.

Oxide layer 40 is next removed within limits 44 to provide a mask for the next implantation step, which is a heavy deposition of (p) type dopant. The (p) dopant is diffused in a subsequent thermal cycle to create shallow (p+) junction isolation regions 46 and a (p+) deep collector region 48. Each shallow isolation region 46 overlies a respective deep isolation region 36, and region 48 overlies VPNP buried collector region 28. Deep collector region 48 is preferably annular or otherwise endless.

The deposition of the (p) dopant is followed by a thermal diffusion drive-in step such that shallow junction isolation regions 46 become continuous with deep junction isolation regions 36, and such that deep collector region 48 will become continuous with buried collector region 28. In this diffusion step, dopant diffuses upwardly from semiconductor substrate 10 at the same time that dopant diffuses downwardly from the surface of epitaxial layer 38. This up-diffusion establishes upper boundaries 50 of collector regions 14 and 16 and upper boundary 52 of VPNP collector region 28.

In the various diffusion steps conducted, it is important to balance the thermal cycles in order to get the proper amount of diffusion. Hence, earlier-created structures should be subjected to a less severe thermal cycle than later-created structures if all other parameters are the same, because the later thermal cycles will affect the extent and concentrations of earlier created structures as well as the later ones.

Next, oxide layer 40 is removed within limits 57 and an (n) type dopant is implanted therein to form an (n−) base region 58 for the VPNP transistor. Subsequently, oxide layer 40 is removed within limits 60 to permit the implantation of an (n) type dopant such as antimony. After this implantation, a thermal diffusion drive-in step is conducted on epitaxial layer 38 such that the (n) type dopant implanted between limits 57 and between limits 60 diffuses to create threshold adjust regions 62 and to set VPNP base region 58. Threshold adjust regions 62 are desirable to prevent parasitic PMOS transistors between (p) diffusions, such as diffused regions 46 and 48. Threshold adjust regions 62 control the junction breakdown voltage such that it can exceed the standard 45-volt operating voltage.

Turning now to FIG. 3, a portion of oxide layer 40 is removed within limits 64 in NPN transistor area 15, VPNP transistor area 27, and JFET area 19. Then, a (p) type dopant is deposited and thermally diffused to create a (p+) NPN transistor base region 66, a VPNP transistor (p+) emitter region 70, an annular or endless (p+) contact region 72 inside VPNP deep collector region 48, a (p+) JFET source region 74 and a (p+) JFET drain region 76. After this step, high sheet resistance resistors (not shown) may be patterned by removal of certain portions of oxide layer 40 (not shown) with a subsequent oxidation and implantation to create the resistors (not shown) in layer 38.

Next, oxide is removed from oxide layer 40 down to the surface 42 of the epitaxial layer 38 within limits 78 in all three device areas 15, 19 and 27 for masking the deposition of an (n) type dopant. The dopant thus deposited is subsequently thermally diffused to create a conventional vertical NPN emitter region 80, a collector contact region 82 for the conventional NPN transistor, a vertical PNP base contact region 84, a buried region contact 86 for ohmic contact to buried region 24, and a JFET gate contact region 88. In the embodiment shown, base contact region 84 is annular or otherwise endless.

To illustrate further steps in the fabrication of the JFET, a sectional detailed view is shown in FIG. 3a. Field oxide 40 is removed between limits 90 and a thin gate oxide 92 is grown over the exposed surface of epitaxial layer 38. An (n) type dopant, preferably phosphorus, is next implanted through gate oxide 92 to form a top gate region 94 that extends from gate contact region 88 to both source region 74 and drain region 76. After this implantation step, a layer of photoresist (not shown) is used to mask all areas of gate oxide 92 except a window extending from drain region 76 to source region 74. This remaining exposed area is subjected to a boron implantation step to create a JFET channel region 96 that extends from source region 74 to drain region 76.

The final steps of the preferred process are shown in FIG. 4. The photoresist is stripped and a middle-level oxide layer 98 is deposited over the surface of oxide layer 40. Middle-level oxide layer 98 is then densified in a thermal step. A plurality of contact orifices 100 are next patterned and etched into middle-level oxide layer 98. The middle-level oxide layer 98 is then reflowed into the contact orifices 100 to produce sloping sidewalls thereof. A respective orifice 102 in field oxide layer 40 is opened below each contact orifice 100 to expose the surface 42 of the epitaxial layer 38 therebeneath. Metal leads 104–118 are then deposited, patterned and etched according to conventional methodology.

An important aspect of the invention is the existence of a middle level oxide portion 120 that is left over JFET channel 96. Top gate metal lead 117 is patterned and etched not only to contact gate contact region 88, but to extend over channel 96 spaced therefrom by middle level oxide portion 120. The existence of middle level oxide portion 120 allows the achievement of up to 45 volts in operating voltage. The standard (p) channel JFET without middle level oxide portion 120 would only operate up to a limit of approximately 32 to 33 volts because of problems associated with the electric field intensification at the drain/top gate junction. Middle level oxide portion 120 reduces the field intensification that occurs there, and allows the breakdown voltage to be extended out to as much as 50 volts. Middle level oxide portion 120 therefore allows the construction of a 45-volt chip. A passivating nitride layer (not shown) is preferably added thereafter to passivate the exposed surface of the completed integrated circuit.

FIG. 5 is a greatly enlarged schematic cross sectional view of a capacitor that can be formed during the fabrication process of the other devices above described, with like numbers identifying like structure as appropriate. In a separate area of (p) type semiconductor substrate 10, a deep isolation junction region 121 is implanted with a (p) type dopant at the same time that buried collector region 28 and deep junction isolation regions 36 (FIG. 1) are implanted. The epitaxial layer 38 is then grown on semiconductor substrate 10 and second oxide layer 40 is grown on epitaxial layer 38. An orifice (not shown) is next opened into oxide layer 40 and a (p) type dopant is deposited on the surface 42 of layer 38 at the same time that the (p) type deposition is performed for shallow junction isolation regions 46 and deep collector region 48 (FIG. 2). Next, a thermal diffusion step is performed that up-diffuses dopant from region 121 and down-diffuses the dopant deposited on the surface 42 of epitaxial layer 38. This combined up-diffusion and down-diffusion creates a continuous junction isolation region 122 that extends from epitaxial surface 42 into semiconductor substrate 10.

Prior to the doping/diffusion sequence that creates NPN emitter region 80, VPNP base contact region 84 and JFET gate contact region 88 (FIG. 3), a polycrystalline silicon layer is deposited, patterned with a photoresist mask, and etched to form a polysilicon electrode 124. Electrode 124 is rendered conductive by a heavy deposition of the (n) type dopant used to create emitter region 80, top gate contact region 88 and VPNP base contact region 84. The diffusion step by which the emitter dopant is diffused into regions 80, 84 and 88 will at the same time cause an oxide layer 126 to grow from the exposed surface of polysilicon electrode 124.

Oxide layer 126 is removed within a central region 128 of the outer polysilicon surface. This central region 128 then has deposited on it a compressive-tension nitride dielectric layer 130 that is patterned and etched using conventional photoresist masking techniques to leave the portion of layer 130 shown.

Middle level oxide layer 98 is deposited, densified, a contact opened therein, and reflowed at the same time that these steps are performed on the middle level oxide layer 98 as shown in FIG. 4. Finally, an outer metal electrode 132 is deposited, patterned and etched at the same time that metal contacts 104–118 are formed.

In summary, a unified process for the fabrication of a vertical PNP transistor, a (p) channel JFET transistor and a metal/nitride/polysilicon capacitor, as well as conventional vertical NPN transistors and other standard devices used in linear bipolar/JFET integrated circuits, has been shown and described. The unified process eliminates many masking steps and permits increased flexibility in circuit design.

While preferred embodiments of the invention have been shown and described in the above Detailed Description, the invention is not limited thereto but only by the scope and spirit of the appended claims.

What is claimed is:

1. A process for fabricating a vertical bipolar transistor and a junction field effect transistor (JFET) using a single semiconductor substrate of a first conductivity type, comprising the steps of:
   forming a JFET buried region of a second conductivity type at a face of the semiconductor substrate;
   forming a bipolar buried region of the second conductivity type at the face and spaced from the JFET buried region;
   forming a collector region of the first conductivity type at the face and within the bipolar buried region;
   forming an epitaxial semiconductor layer of the second conductivity type on the face of the semiconductor substrate;
   extending the JFET buried region and the collector region into the epitaxial layer by thermal diffusion;
   forming a deep collector region of the first conductivity type to extend from an outer face of the epitaxial layer to the collector region;
   forming a base region of the first conductivity type at the face of the epitaxial layer over the collector region and spaced therefrom;
   simultaneously forming an emitter region, a JFET source region and a JFET drain region of the first conductivity type at the face of the epitaxial layer, the emitter region formed within the base region, the JFET source and drain regions formed over and spaced from the JFET buried region and laterally spaced from each other; and
   simultaneously forming a base contact region and a gate contact region of the second conductivity type at the face of the epitaxial layer, the base contact region formed within the base region and spaced from the emitter region, the gate contact region formed over the JFET buried region and spaced from the source and drain regions.

2. The process of claim 1, wherein said first conductivity type is (p).

3. The process of claim 1, and further comprising the steps of:
   forming at least one deep junction isolation region to be of the first conductivity type in the semiconductor substrate at the same time as said step of forming the collector region therein, the deep junction isolation region formed in between the collector region and the JFET buried region; and
   forming at least one shallow junction isolation region of the first conductivity type in the epitaxial layer over the deep junction isolation region at the same time as said step of forming the deep collector region, such that the shallow junction isolation region and the deep junction isolation region are joined.

4. The process of claim 3, and further comprising the step of:
   forming a field adjust region with a dopant of the second conductivity type at the face of the epitaxial layer to be disposed between the base region and the shallow junction isolation region.

5. The process of claim 3, and further comprising the steps of:
   simultaneously up-diffusing dopant from the deep junction isolation region and from the collector region into the epitaxial layer; and
   simultaneously down-diffusing dopant from the shallow isolation junction region and from the deep collector region, such that the deep collector region makes contact with the collector region and such that the shallow and deep junction isolation regions become continuous.

6. The process of claim 1, and further comprising the step of down-diffusing dopant from the deep collector region until the deep collector region becomes continuous with the collector region.

7. The process of claim 1, and further comprising the step of forming a first oxide layer across an outer face of the semiconductor substrate; and
   prior to each of said respective steps of forming the collector region, forming the bipolar buried region and forming the JFET buried region, removing for each said respective step a respective predetermined portion of the oxide layer so that the oxide layer acts as a doping mask for said respective step.

8. The process of claim 1, and further comprising the steps of:
   after said step of forming the epitaxial semiconductor layer, forming an oxide layer on an outer face of the epitaxial layer; and
   prior to each of said respective steps of forming the deep collector region, forming the base region, and forming the emitter region, removing a respective portion of the oxide layer to act as a respective dopant mask for said respective step.

9. The process of claim 1, and further comprising the steps of:
   after said step of simultaneously forming the base contact region and the gate contact region, forming a gate insulator layer over the epitaxial layer over a channel region thereof between the source region and the drain region, and to laterally extend to the gate contact region;
   implanting dopant of the second conductivity type through the gate insulator layer to form a top gate extending from the gate contact region to the source and drain regions; and
   implanting dopant of the first conductivity type through the gate insulator layer to dope the channel region.

10. The process of claim 1, and further comprising the steps of:
    forming a deep junction isolation region of the first conductivity type in the substrate at the same time as said step of forming the collector region; and
    forming a capacitor over the junction isolation region.

11. The process of claim 10, and further comprising the step of forming a shallow junction isolation region of the first conductivity type in the expitaxial layer for the capacitor at the same time as said step of forming the deep collector region, such that the deep junction isolation region and the shallow junction isolation region will become a continuous junction isolation region.

12. The process of claim 11, and further comprising the steps of:
    forming an oxide layer on the expitaxial layer over the junction isolation region; and
    forming a capacitor on the oxide layer over the junction isolation region.

13. The process of claim 1, wherein a capacitor is formed in a capacitor area of the semiconductor substrate spaced from the vertical transistor and the lateral transistor, said process further including the steps of:
    forming a polycrystalline silicon capacitor electrode to be insulatively spaced over the epitaxial layer in the capacitor area; and doping the polycrystalline silicon electrode to be highly conductive at the same time as said step of simultaneously forming the base contact region and the gate contact region.

14. The process of claim 1, and further including the step of forming a bipolar buried region contact region of the second conductivity type at the outer face of the expitaxial layer over the bipolar buried region and spaced from the deep collector region, at the same time as said step of simultaneously forming the base contact region and the gate contact region.

15. A process for fabricating a junction field effect transistor (JFET) and a capacitor using a single semiconductor substrate of a first conductivity type, comprising the steps of:

forming a buried region of a first conductivity type at a face of the semiconductor substrate;

simultaneously forming at least two deep junction isolation regions at the face to be of the first conductivity type, the first deep junction isolation region formed between a JFET area of the substrate and a capacitor area of the substrate, the second junction isolation region formed within the capacitor area;

forming an epitaxial layer of the second conductivity type on the face;

forming an insulator layer on an outer face of the epitaxial layer;

up-diffusing dopant to extend the buried region and the deep junction isolation regions into the epitaxial layer;

simultaneously forming at least two shallow junction isolation regions of the first conductivity type at the outer face of the epitaxial layer, each shallow junction isolation region formed to be continuous with a respective deep junction isolation region;

forming a polycrystalline layer including silicon on the insulator layer over the second shallow junction isolation region;

forming a middle-level insulating layer over the polycrystalline layer and the insulating layer;

opening orifices in the middle-level insulating layer to the polycrystalline layer and to a region of the insulating layer over a gate contact region of the epitaxial layer in the JFET area;

removing the region of the insulating layer to expose the gate contact region; and simultaneously doping the polycrystalline layer and the gate contact region to respectively form a conductive capacitor electrode and a top gate contact.

16. The process of claim 15, wherein said insulator layer comprises silicon dioxide, the process comprising the further step of thermally growing at least a portion of the insulator layer during said step of up-diffusing dopant.

17. The process of claim 15, and further comprising the steps of:

diffusing dopant into the face of the epitaxial layer within a bipolar transistor area spaced from the JFET and capacitor areas to form a base contact region;

at the same time as said step of diffusing dopant, growing an oxide layer over the polycrystalline layer;

removing the oxide layer from a selected portion of the polycrystalline layer; and forming a capacitor dielectric layer on the polycrystalline layer.

18. The process of claim 15, and further including the steps of:

forming a bipolar transistor collector region of the first conductivity type in a bipolar transistor area of the semiconductor substrate spaced from the JFET and capacitor areas during said step of forming the deep junction isolation regions;

extending the collector region into the epitaxial layer during said step of up-diffusing dopant; and forming a deep collector region of the first conductivity type in the epitaxial layer over the collector region to be continuous with the collector region, during said step of forming the shallow junction isolation regions.

19. In a process for the simultaneous fabrication of a bipolar transistor and a junction field effect transistor (JFET) at a face of a single semiconductor substrate of a first conductivity type, the method comprising the steps of:

forming an epitaxial layer of a second conductivity type on the semiconductor substrate;

simultaneously forming a JFET source region, a JFET drain region and a bipolar emitter region all to be of the first conductivity type and at an outer face of the epitaxial layer, the source and drain regions formed so as to be spaced from each other and within a JFET area of the epitaxial layer, the emitter region formed within a bipolar transistor area of the epitaxial layer spaced from the JFET area; and simultaneously forming a base contact region and a gate contact region in the epitaxial layer to be of the second conductivity type, the base contact region formed in the bipolar transistor area and spaced from the emitter region, the gate contact region formed in the JFET area and spaced from the source and drain regions.

20. A process for fabricating a junction field effect transistor (JFET) and a capacitor using a single semiconductor substrate of a first conductivity type, comprising the steps of:

forming a buried region of a first conductivity type at a face of the semiconductor substrate;

forming at least one deep junction isolation region at the face to be of the first conductivity type, the at least one deep junction isolation region formed between a JFET area of the substrate and a capacitor area of the substrate;

forming an epitaxial layer of the second conductivity type on the face;

forming an insulator layer on an outer face of the epitaxial layer;

up-diffusing dopant to extend the buried region and the at least one deep junction isolation region into the epitaxial layer;

forming at least one shallow junction isolation region of the first conductivity type at the outer face of the epitaxial layer, the at least one shallow junction isolation region formed to be continuous with the at least one deep junction isolation region;

forming a polycrystalline layer including silicon on the insulator layer over the capacitor area;

forming a middle-level insulating layer over the insulating layer;

removing a region of the insulating layer to expose a gate contact region; and simultaneously doping the polycrystalline layer and the gate contact region to respectively form a conductive capacitor electrode and a top gate contact.

21. The process of claim 20, wherein said insulator layer comprises silicon dioxide, the process comprising the further step of thermally growing at least a portion of the insulator layer during said step of up-diffusing dopant.

22. The process of claim 20, and further comprising the steps of:
  diffusing dopant into the face of the epitaxial layer within a bipolar transistor area spaced from the JFET and capacitor areas to form a base contact region:
  at the same time as said step of diffusing dopant, growing an oxide layer over the polycrystalline layer;
  removing the oxide layer from a selected portion of the polycrystalline layer; and
  forming a capacitor dielectric layer on the polycrystalline layer.

23. The process of claim 20, and further including the steps of:
  forming a bipolar transistor collector region of the first conductivity type in a bipolar transistor area of the semiconductor substrate spaced from the JFET and capacitor area during said step of forming the deep junction isolation regions;
  extending the collector region into the epitaxial layer during said step of up-diffusing dopant; and
  forming a deep collector region of the first conductivity type in the epitaxial layer over the collector region to be continuous with the collector region, during said step of forming the shallow junction isolation regions.

24. The process of claim 20 including simultaneously forming a second deep junction isolation region within the capacitor area, simultaneously forming a second shallow junction isolation region to be continuous with said second deep junction isolation region, and forming the polycrystalline layer over the second shallow junction isolation region.

* * * * *